United States Patent [19]
Cattenot

[11] Patent Number: 6,038,999
[45] Date of Patent: Mar. 21, 2000

[54] DEVICE FOR THE RELATIVE VACUUM DEPOSITION OF A MATERIAL ON PARTS IN A LOOSE STATE

[75] Inventor: Jean-Marc Cattenot, Cizc, France

[73] Assignee: Metatherm, Pont de Roide, France

[21] Appl. No.: 08/849,291

[22] PCT Filed: Nov. 10, 1995

[86] PCT No.: PCT/FR95/01485

§ 371 Date: Jul. 15, 1997

§ 102(e) Date: Jul. 15, 1997

[87] PCT Pub. No.: WO96/16198

PCT Pub. Date: May 30, 1996

[30] Foreign Application Priority Data

Nov. 18, 1994 [FR] France .................................. 94 14488

[51] Int. Cl.[7] .............................................. C23C 16/00
[52] U.S. Cl. ...................................... 118/723 R; 118/715
[58] Field of Search .............................. 118/723 R, 719, 118/715

[56] References Cited

U.S. PATENT DOCUMENTS

| | | | |
|---|---|---|---|
| 3,394,679 | 7/1968 | Bentley, Jr. ................................ | 118/49 |
| 4,116,161 | 9/1978 | Steube ..................................... | 118/49.1 |
| 4,397,885 | 8/1983 | Akai et al. ................................ | 427/38 |
| 5,470,388 | 11/1995 | Goedicke et al. ....................... | 118/716 |

FOREIGN PATENT DOCUMENTS

| | | |
|---|---|---|
| 57-188678 | 11/1982 | Japan . |
| 2124259 | 2/1984 | United Kingdom . |

*Primary Examiner*—Bruce Breneman
*Assistant Examiner*—Erin Fieler
*Attorney, Agent, or Firm*—Nilles & Nilles SC

[57] ABSTRACT

Machine for the deposition, under relative vacuum, of a material on parts (1) in a loose state, comprising a chamber (20, 20') in which there is placed at least one cathode (21, 21') that is negatively polarized with respect to the chamber, and conduits having holes and tubes (11, 12; 11', 12'; 11", 12") for keeping the chamber (20, 20') under a relative vacuum of at least one gaseous agent. The chamber (20, 20') is mounted rotationally about an axis inclined (D, D') with respect to the horizontal inside a housing (10, 10') that carries the relative vacuum, the chamber (20, 20') having an upper aperture (22, 22') for introducing the parts (1) in a loose state and a lower aperture (23, 23') for discharging the parts after the deposition of the material. Application to vacuum deposition techniques.

11 Claims, 2 Drawing Sheets

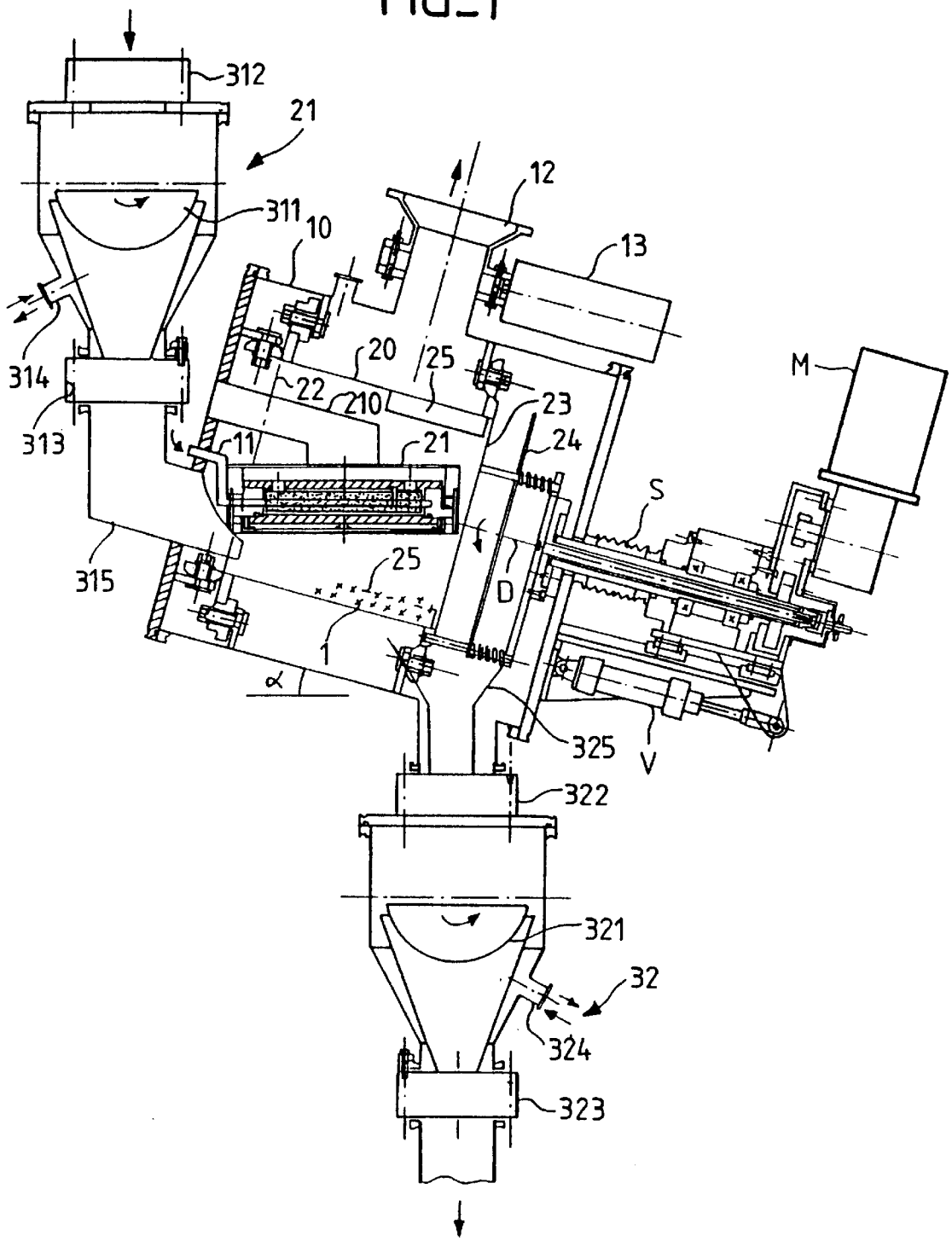
FIG_1

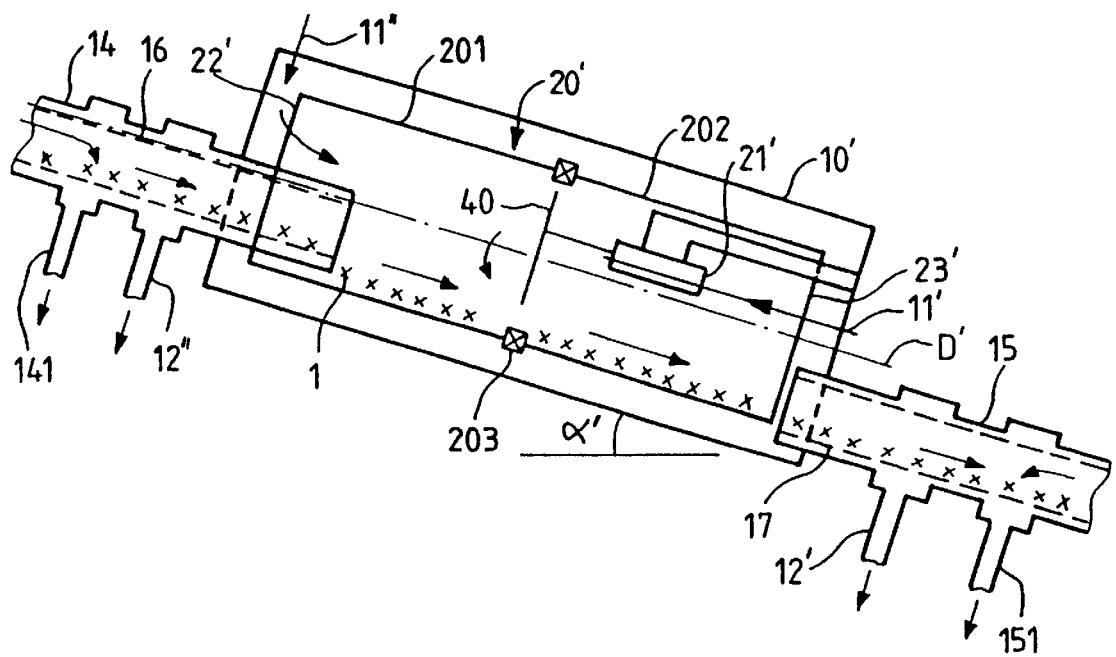
FIG_2
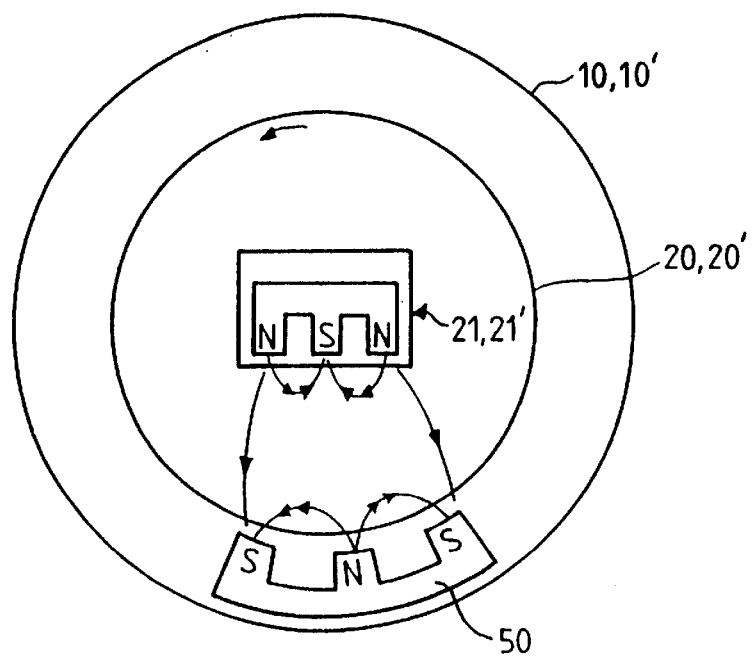
FIG_3

DEVICE FOR THE RELATIVE VACUUM DEPOSITION OF A MATERIAL ON PARTS IN A LOOSE STATE

BACKGROUND OF THE INVENTION

1. Field of the Invention

The present invention relates to a machine for the deposition under a relative vacuum of a material on parts in a loose state.

The invention can be applied to special advantage in the field of deposition under relative vacuum according to the techniques known as PVD (physical vapor deposition) or PACVD (plasma-assisted chemical vapor deposition) and PECVD (plasma-enhanced chemical vapor deposition). These techniques are used to deposit a variety of materials such as metals (aluminum, titanium, copper, gold), carbon, oxides, titanium compounds (carbide, nitride) etc. on practically all supports, especially metals, glass, ceramic as well as plastic materials (ABS, polycarbonate and PMMA).

The fields of application of the invention are very wide-ranging and include the making of decorative layers for spectacles, watches, pens, etc., treatment for tools by the deposition of hard layers on cutting tools or striking tools for example or again certain special applications such as anti-corrosion protective coatings, the manufacture of optical reflectors, etc.

2. Discussion of the Related Art

Whatever the technique used, whether it is PVD, PACVD or PECVD, the known machines for deposition under relative vacuum comprise a chamber in which one or more cathodes are placed, possibly cathode-magnetron devices in PVD, that are negatively polarized with respect to said chamber. Means are also provided for maintaining the chamber under a relative vacuum of one or more gaseous agents. These means generally consist of a vacuum pump used to sweep the chamber with an inflow of gaseous agents coming from any reservoir.

In the case of the PVD technique, said gaseous agents may be a neural gas to which, as needed, there may be added a reactive gas such as oxygen, nitrogen or methane when the material to be deposited is an oxide, nitride or metal carbide, the metal being produced by the spraying of the cathode under the effect of the bombardment of the accelerated ions of neutral gas.

The PACVD or PECVD techniques are implemented by means of gaseous agents that are broken down by a cathode into ion species capable of reacting chemically with the constituent material of the parts to be coated.

It must be noted however that, in known relative vacuum deposition machines such as those mentioned further above, the parts to be treated are generally held mechanically within the chamber by fasteners which, at the end of the treatment, leave a trace on the parts characterized by the absence of deposition at the place where these fasteners have been in contact with the parts.

Even if it is sometimes possible to arrange matters so that the trace is formed at a place that causes no inconvenience to the part considered, a second deposition may prove to be necessary if it is desired to eliminate all traces resulting from the masking of the part by the fastener. This, besides, is not always feasible in view of the conditions of coating.

It may be also be noted that the positioning of the parts one by one by means of fasteners in the treatment chamber takes up a great deal of time and therefore contributes to an increase in the overall cost of the deposition operation. This is especially true when the parts to be coated are, for example, the links of a bracelet that have to be threaded.

OBJECTS AND SUMMARY OF THE INVENTION

The U.S. Pat. No. 4,116,161 tries to solve these different problems proposing a machine for deposition under relative vacuum comprising a housing linked to the means of vacuuming and inside which two rotating cylinders are horizontally placed in order to mix the pieces to be treated. Even though the cylinders are mounted inclinable so as to allow evacuation of the pieces at the end of the deposition operation, their position remains perfectly horizontal during the entire vaporisation phase. This characteristic unfortunately brings on an inadequate mixture of the pieces which tend to slide along the inside wall of each rotating cylinder, without mixing or rolling over so as to maximise exposure to ionic emissions. Also, the exact position of the electrodes integrating the metal to be vaporised, that is, outside the rotating cylinders, is not favourable to obtaining a homogenous deposition.

Thus, the technical problem to be resolved by the present invention is that of proposing a machine for the deposition of a material under relative vacuum, said machine enabling the making of a perfectly uniform deposit of material on the parts to be coated while avoiding tedious handling operations related to the installation of said parts within the treatment chamber.

The approach to the technical problem raised consists, according to this present invention, of a machine for the deposition under relative vacuum of a material on parts in a loose state, comprising a chamber in which there is placed at least one cathode negatively polarized with respect to said chamber and means for keeping the chamber under a relative vacuum of at least one gaseous agent, said chamber being rotationally mounted about an axis inclined with respect to the horizontal inside a housing that carries said relative vacuum means, the chamber having an upper aperture for the introduction of the parts in a loose state and a lower aperture for discharging said parts after the deposition of said material.

Thus, the parts introduced in a loose state into the deposition machine according to the invention are shaken within the chamber by the rotational motion conveyed to this chamber. This contributes to the obtaining of excellent homogeneity of the deposit on the parts.

The shaking efficiency may be considerably increased when, according to the invention, said chamber has longitudinal turn-over bars designed to shuffle the parts that are in a loose state during the deposition of said material.

As shall be seen in detail further below, the inclination of the chamber with respect to the horizontal enables the parts that are in a loose state to circulate under the effect of gravity alone, from their insertion into the machine up to their recovery after deposition, without its being necessary to use any conveying device.

It will also be observed that, owing to the fact that the parts are treated in a loose state, any manual operation for the individual positioning of the parts in the chamber becomes totally unnecessary.

The machine that is an object of the invention also has the advantage of enabling the coating, by PVD, PACVD and PECVD of very small-sized parts such as screws, whereas the implementation of these techniques is ruled out with the presently known relative vacuum deposition machines because the parts, given their small sizes, cannot be held therein.

Two embodiments of the machine according to the invention are envisaged.

In a first embodiment, it is provided that, for intermittent operation, the chamber is provided with a movable shutter plate capable, firstly, of retaining the parts that are in a loose state in the chamber by plugging the lower discharging aperture during the deposition of the material and, secondly, of removing the parts after deposition of the material by the opening of the lower discharging aperture.

In a second embodiment, the invention provides that, for continuous operation, the housing will comprise an upper conduit for the introduction of parts in a loose state into the chamber and a lower conduit for the discharging, from the chamber, of the parts after the deposition of the material, each of said conduits being provided with a hole for the pumping of external air, designed to isolate the housing from the ambient atmosphere.

BRIEF DESCRIPTION OF THE DRAWINGS

The following description, made with reference to the appended drawings given by way of non-exhaustive examples, shall give a clear idea of the invention and the way in which it can be achieved.

FIG. 1 is a side view of a first embodiment of a device for deposition under relative vacuum according to the invention, with intermittent operation.

FIG. 2 is a side view of a second embodiment of a device for deposition under relative vacuum according to the invention, with continuous operation.

FIG. 3 is a front view of a device for deposition under relative vacuum according to the invention, showing a device for the creation of a magnetic focusing field.

FIG. 1 shows a side view of a machine for the vacuum deposition of a material on parts 1 in a loose state, this machine working in intermittent mode. This machine has a housing 10 provided incorporating provisions enabling the maintenance, within the housing, of a relative vacuum of at least one gaseous agent which, as recalled further above, may be a neutral gas or a gas capable of reacting with the material constituting the parts I to be treated, the choice of the gaseous agent depending on the deposition technique used.

The housing 10 encloses a chamber 20 in which there is placed a cathode 21 or a cathode-magnetron that is negatively polarized with respect to chamber 20 and is designed conventionally to carry out the operation for the deposition of material on the parts 1. It may be noted that, in the case of the PECVD technique, the cathode may be formed by the support for the parts 1 to be coated.

DESCRIPTION OF THE PREFERRED EMBODIMENTS

As can be seen in FIG. 1, the chamber 20 is mounted so as to be rotational about an axis D inclined by an angle α with respect to the horizontal, the angle α possibly being of the order of 15° for example. This arrangement has the twofold advantage of enabling the parts 1 to be treated in a loose state without any need for them to be held individually in the chamber 20, and of making it possible, as compared with standard devices, to obtain far greater homogeneity of deposition related to the shaking to which the parts are subjected following the rotational motion of the chamber 20.

Furthermore, owing to the inclination of the chamber 20 with respect to the horizontal, it is possible to make the parts 1 in a loose state circulate or tumble through the machine according to the invention under the effect of gravity alone, especially between an upper aperture 22 for introduction into the chamber 20 and a lower aperture 23 for discharge to the exterior of the chamber so that the parts can be recovered after the deposition of said material.

In the example given in FIG. 1, the structure for maintaining the parts under relative vacuum include, firstly, a feeder tube 11 constituted so as to enable an injection of gas on either side of the cathode 21 and, secondly, a vacuum pump, not shown, connected to a pumping hole 12. An adjustment valve 13 is planned in order to adjust the pressure of the relative vacuum in the housing 10 during deposition.

In the context of the machine with intermittent operation of FIG. 1, it can be seen that the chamber 20 is provided with a movable shutter plate 24 capable, firstly, of holding the parts 1 that are in a loose state in the chamber by the plugging of the lower discharging aperture 23 during the deposition operation and, secondly, of removing the parts 1 after the deposition of the material through the release of the lower discharging aperture 23.

According to the embodiment of FIG. 1, the movement of the mobile shutter plate 24 is obtained via a jack V also driving a rotational element comprising a motor M for placing the deposition chamber 20 under rotation, the relative vacuum tightness being provided via the blower S.

FIG. 1 also shows that the chamber 20 has longitudinal turn-over bars 25 designed to shuffle the parts 1 that are in a loose state during the deposition of said material.

It may be recalled that shock absorbers may be mixed with the parts I when they are inserted into the machine of the invention, in order to limit the effects of deterioration likely to affect the quality of deposition when the parts strike one another.

As shown in FIG. 1, the relative vacuum deposition machine of the invention comprises an imperviously sealed lock 31 for the introduction, by gravity, of the parts 1 that are in a loose state into the chamber 20 through the upper introduction aperture 22 and an imperviously sealed chamber 32 for the recovery of parts discharged from the chamber 20, also by gravity, through the lower discharging aperture 23 after the deposition of the material and the release of the mobile shutter plate 24 by the actuation of the jack V.

More specifically, the parts I are first of all introduced into a bowl 311 of the upper introduction lock 31 through an inlet valve 312, the outlet valve 313 of the lock 31 being closed. Then, after the closing of the inlet valve 312, the insertion lock 31 is subjected to pumping through a hole 314. When the deposition chamber 20 is ready to receive a new batch of parts, the outlet valve 313 is open and the bowl 311 containing the parts 1 is turned over so as to convey said parts into the chamber 20 by means of an elbow 315 penetrating the housing 10 up to the level of the upper aperture 22 of the chamber 20. The outlet valve 313 is then closed and air is introduced into the lock 31 by the same hole 314 in order to enable the opening of the inlet valve 312 and the introduction of a new batch of parts 1. Naturally, this operation seeking to supply the treatment chamber 20 with parts is done in masked time during the deposition proper.

This is also the case with the operation of the lock 3 for the recovery of parts 1 after deposition, with a funnel 325 for the collection of the parts at the discharging aperture 23, an inlet valve 322, an outlet valve 323, a tilting bowl 321 and a pumping or air inlet hole 324.

FIG. 1 shows that the cathode 21 is held in the housing 10 by a cathode-holder 210 which takes the form of a vacuum-tight hollow tube that opens out to the exterior of the housing so as to enable the passage of means for supplying the cathode 21 with water and electrical power.

The continuously operating machine shown in FIG. 2 has, on the whole, the same elements as the intermittently operating machine of FIG. 1, namely a housing 10' with relative vacuum containing a deposition chamber 20' in which there is positioned a cathode 21'. Chamber 20' is mounted so as to be rotational about an axis D' inclined by an angle α' with respect to the horizontal, and has an upper aperture 22' for the introduction of the parts 1 in a loose state and a lower aperture 23' for the discharging of the parts after the deposition of the material.

In the embodiment of FIG. 2, the chamber 20' is divided firstly into an upper compartment 201 for the cleansing of the parts 1 and secondly into a compartment 202 for the deposition of the material on the parts. Compartments 201 and 202 are mechanically fixed to each other in their rotational motion but electrically insulated by an insulator 203 and partially separated by a fixed partition element 40 so that each compartment is held under a relative vacuum of a respective gaseous agent: a cleansing gaseous agent for the upper compartment 201, a deposition gaseous agent for the lower compartment 202.

The housing 10' of the machine of FIG. 2 also has an upper conduit 14 for the continuous introduction of parts 1 in a loose state into the upper compartment 201 of the chamber 20' and a lower conduit 15 for the discharging, also continuously, of parts after deposition of said material in the lower compartment 202 of the chamber 20', each of the conduits being provided with a hole, respectively 141, 151, for the pumping of external air, designed to isolate the housing 10' from the ambient atmosphere.

The conduits 14 and 15 also bear pumping holes 12", 12' which, with tubes 11", 11' for the supply of respective gaseous agents, set up a relative vacuum in each of the compartments 201, 202 of the chamber 20'.

Screens 16 and 17 placed in the conduits 14 and 15 prevent the parts 1 from falling into the different pumping holes.

FIG. 3 shows how it is possible to focus the plasma produced by the cathodes 21, 21' of the machines of FIGS. 1 and 2 in order to increase the electronic bombardment and the heating of the parts. To this end, an additional magnetic field is created by pole pieces 50 positioned in the relative vacuum chamber 10, 10' and the deposition chamber 20, 20' facing the pole pieces of the cathode 21, 21'.

What is claimed is:

1. A machine for the deposition, in a continuous or intermittent process, and under relative vacuum, of a material on parts in a loose state, said machine comprising: a housing; a chamber which is carried on said housing and in which there is placed at least one cathode that is negatively polarized with respect to said chamber, and means, carried on said housing, for keeping the chamber under a relative vacuum of at least one gaseous agent, wherein said chamber is mounted rotationally about an axis inclined with respect to the horizontal inside said housing, the chamber having an upper aperture for introducing the parts in a loose state directly into said chamber and a lower aperture for discharging said parts after the deposition of said material.

2. A machine according to claim 1, wherein said chamber has longitudinal turn-over bars designed to shuffle the loose parts during the deposition of said material.

3. A machine for the deposition, in a continuous or intermittent process, and under relative vacuum, of a material on parts in a loose state, said machine comprising: a housing; a chamber which is carried on said housing and in which there is placed at least one cathode that is negatively polarized with respect to said chamber, and means, carried on said housing, for keeping the chamber under a relative vacuum of at least one gaseous agent, wherein said chamber is mounted rotationally about an axis inclined with respect to the horizontal inside said housing, the chamber having an upper aperture for introducing the parts in a loose state directly into said chamber and a lower aperture for discharging said parts after the deposition of said material, wherein, for intermittent operation, the chamber is provided with a movable shutter plate capable of 1) retaining the parts that are in a loose state in said chamber by plugging said lower discharging aperture during deposition of said material, and 2) of removing said parts after the deposition of the material by opening the lower discharging aperture.

4. A machine according to claim 3, further comprising an imperviously sealed lock for the introduction, by gravity, of the parts in a loose state into said chamber through the upper introduction aperture and an imperviously sealed lock for the recovery of said parts removed from the chamber by gravity through the lower discharging aperture after the deposition of said material and the release of said movable shutter plate.

5. A machine for the deposition, in a continuous or intermittent process, and under relative vacuum, of a material on parts in a loose state, said machine comprising: a housing; a chamber which is carried on said housing and in which there is placed at least one cathode that is negatively polarized with respect to said chamber, and means, carried on said housing, for keeping the chamber under a relative vacuum of at least one gaseous agent, wherein said chamber is mounted rotationally about an axis inclined with respect to the horizontal inside said housing, the chamber having an upper aperture for introducing the parts in a loose state directly into said chamber and a lower aperture for discharging said parts after the deposition of said material, wherein, for continuous operation, said housing comprises an upper conduit for introducing parts in a loose state into said chamber and a lower conduit for discharging, from the chamber, said parts after deposition of said material, each of said conduits being provided with a hole for the pumping of external air, said hole being configured to isolate the housing from the ambient atmosphere.

6. A machine according to claim 5, wherein said chamber is divided into an upper compartment for the cleansing of the parts in a loose state and a lower compartment for the deposition of the material on said parts, said compartments being mechanically fixed to each other in rotation, electrically insulated, and partially separated via a fixed partition element.

7. A machine for the deposition, in a continuous or intermittent process, and under relative vacuum, of a material on parts in a loose state, said machine comprising: a housing; a chamber which is carried on said housing and in which there is placed at least one cathode that is negatively polarized with respect to said chamber, and means, carried on said housing, for keeping the chamber under a relative vacuum of at least one gaseous agent, wherein said chamber is mounted rotationally about an axis inclined with respect to the horizontal inside said housing, the chamber having an upper aperture for introducing the parts in a loose state directly into said chamber and a lower aperture for discharging said parts after the deposition of said material, wherein pole pieces are positioned beneath the housing and the chamber facing the cathode.

8. A continuously or intermittently operating machine for the vacuum deposition of a material on loose parts, said machine comprising:

a chamber which is rotatable about an axis that is inclined with respect to the horizontal, said chamber having formed therein 1) a hollow interior which is configured to receive the loose parts and which is configured to allow the loose parts to tumble therethrough by gravity during the vacuum deposition process, 2) an upper aperture which is configured to feed the loose parts directly into said interior of the chamber, and 3) a lower aperture which is configured to discharge the loose parts from said interior of said chamber after the material is deposited on the loose parts;

at least one cathode which is negatively polarized with respect to said chamber so that said chamber forms an anode; and a vacuum assembly which communicates with said interior of said chamber and which is configured to maintain said interior under a relative vacuum of a gaseous agent.

9. A method for depositing a material on loose parts, said method comprising:

rotating a chamber about an axis which is inclined with respect to the horizontal, said chamber having formed therein 1) a hollow interior, 2) an upper aperture opening into said interior, and 3) a lower aperture opening into said interior; and while said chamber is inclined about said axis, 1) creating a relative vacuum of a gaseous agent within said interior,
2) feeding said loose parts into said interior through said upper aperture,
3) rotating said chamber about said axis so that said loose parts tumble through said chamber by gravity,
4) while said chamber is rotating about said axis and said loose parts are tumbling through said chamber, depositing said material on said loose parts via a vacuum deposition process using a cathode which is negatively charged relative to said chamber so that chamber forms an anode, and
5) discharging said loose parts from said interior through said lower aperture.

10. A method according to claim 9, where said process is a continuous process, and wherein said steps 1) through 5) continue without interruption and without cessation of cylinder rotation.

11. A method according ton claim 9, wherein said process is an intermittent process, and further comprising closing said upper and lower apertures during the deposition step to prevent ingress or egress of parts during the deposition step.

* * * * *